United States Patent [19]

Ueno

[11] Patent Number: 5,140,704
[45] Date of Patent: Aug. 18, 1992

[54] PULSE NOISE SUPPRESSING SYSTEM FOR FM RECEIVER

[75] Inventor: Eizi Ueno, Saitama, Japan

[73] Assignee: Pioneer Electric Corporation, Tokyo, Japan

[21] Appl. No.: 335,327

[22] Filed: Apr. 10, 1989

[30] Foreign Application Priority Data

Aug. 10, 1988 [JP] Japan .................. 63-198016

[51] Int. Cl.$^5$ .................................. H04B 1/10
[52] U.S. Cl. ........................... 455/296; 455/234.1
[58] Field of Search ............. 455/302, 303, 306, 308, 455/234, 96, 296, 212; 375/102, 103, 104, 98, 99

[56] References Cited

U.S. PATENT DOCUMENTS

| | | | |
|---|---|---|---|
| 3,699,457 | 10/1972 | Wright | 455/224 |
| 3,979,679 | 9/1976 | Bush et al. | 455/213 |
| 4,151,471 | 4/1979 | Packard et al. | 455/296 |
| 4,480,335 | 10/1984 | Kishi | 455/212 |
| 4,587,620 | 5/1986 | Niimi et al. | 455/296 |
| 4,606,075 | 8/1986 | Eastmond | 455/234 |
| 4,619,002 | 10/1986 | Thro | 455/234 |
| 4,761,828 | 8/1988 | Rinderle | 455/296 |

FOREIGN PATENT DOCUMENTS 0066110 8/1982 European Pat. Off. .
2847824 5/1989 Fed. Rep. of Germany .

OTHER PUBLICATIONS

German Search Report.
Patent Abstracts of Japan, vol. 9, No. 220 (E-341), Sep. 6, 1985; & JP-A-60 079 830 (Hitachi) May 7, 1985 *En entier*.

Primary Examiner—Edward L. Coles, Sr.
Assistant Examiner—Jill Jackson
Attorney, Agent, or Firm—Sughrue, Mion, Zinn Macpeak & Seas

[57] ABSTRACT

A pulse noise suppressing system for an FM receiver which includes extracting a noise component from an FM detection signal; amplifying the noise component extracted with a gain that is controlled by an automatic gain control signal corresponding to a level of the amplified component; and providing an off control signal which is triggered when the level of the amplified component is higher than a predetermined level, the off control signal being used to interrupt the transmission of an FM detection signal to a following stage, thereby suppressing a pulse noise included in the FM detection signal. The predetermined level at which the off control signal is triggered is changed in accordance with the automatic gain control signal, or in accordance with a level detection signal corresponding to a level of a received signal.

10 Claims, 4 Drawing Sheets ent included in the FM detection signal outputted by an FM detector circuit (not shown). The noise component extracted by the HPF 3 is amplifi.de by the noise amplifier 4 and then rectified by the recti- fier circuit 5, so that the rectifier circuit 5 outputs a noise detection signal whose level corresponds to the noise level. When the noise is in the form of a pulse, the level of the noise detection signal is higher than the predetermined value or level. This noise detection sig- nal triggers the monostable multivibrator 6, which out- puts a pulse-like signal. The pulse-like signal is applied as the "off" control signal to the analog switch 2. When the noise level is high, the analog switch 2 is turned off to prevent the application of the noise to the stereo demodulation circuit (MPX).

PULSE NOISE SUPPRESSING SYSTEM FOR FM RECEIVER

FIELD OF THE INVENTION

This invention relates to a pulse noise suppressing system for an FM receiver in which pulse noise compo- nents included in an FM detection signal are suppressed so as to prevent their transmission to a following stage.

BACKGROUND OF THE INVENTION

A conventional pulse noise suppressing system of this type is shown in FIG. 1. In the system, an FM detection signal subjected to FM detection is applied through an input buffer (not shown) to a delay circuit 1 where it is delayed a predetermined period of time. The delayed FM detection signal is then applied to an analog switch 2. The FM detection signal is also applied to noise ex- tracting means 3, namely, a HPF (High-Pass Filter) for extracting a noise component from the FM detection signal. The noise component passed through the HPF 3 is applied to noise amplifying means, namely, a noise amplifier 4, where it is amplified. The noise component thus amplified is rectified by a rectifier circuit 5, which outputs a noise detection signal whose level corre- sponds to the magnitude of the noise component. The noise detection signal is applied to a monostable multivi- brator 6 which functions as a control signal generating circuit to generate an on-off control signal for control- ling the on-off operation of the aforementioned analog switch 2.

When the level of the noise detection signal (which is applied to the monostable multivibrator 6), is higher than a predetermined value or level, the monostable multivibrator 6 outputs a pulse-like "off" control signal. The "off" control signal is applied to the control input terminal of the analog switch 2, to perform the "off" control of the analog switch 2. The output signal of the analog switch 2 is applied through a level hold circuit 7 to a stereo demodulation circuit (MPX). The level hold circuit 7 operates as follows: When the analog switch 2 is turned off, the level hold circuit 7 continuously holds the signal level provided before the analog switch 2 is turned off.

On the other hand, the rectifier circuit 5 also applies an automatic gain control signal (AGC signal) to the noise amplifier 4 for controlling the gain of the noise amplifier 4 according to the level of the noise compo- nent.

The cut-off frequency of the HPF 3 is set to about 100 KHz so that the HPF 3 transmits only a high frequency noise compon The AGC signal applied to the noise amplifier 4 oper- ates as follows. When the noise level increases, the AGC signal lowers the gain of the noise amplifier thereby preventing the analog switch 2 from being kept turned-off.

When the antenna input of a front end is low, the white noise inherent in an FM signal increases. If im- pulse noises are superposed on the white noise such that the impulses are above the threshold level as indicated at I in FIG. 2. then the noise components trigger the monostable multivibrator 6. As a result, the analog switch 2 is erroneously operated. If the analog switch 2 is operated in response to noises other than the pulse noise, then distortions or additional noises are pro- duced, or the sensitivity is lowered.

In other words, when the receiving signal level is low and the noise level is not uniform, the conventional system shown in FIG. 1 does not operate properly.

SUMMARY OF THE INVENTION

Accordingly, an object of this invention is to provide a pulse noise suppressing system for an FM receiver which provides the feature that when the receiving signal level is low, the level of any impulse noise in not close to the threshold level of the control signal gener- ating means (monostable multivibrator).

In order to achieve the foregoing object, the present invention provides, according to one embodiment thereof, a pulse noise suppressing system for an FM receiver comprising: noise extracting means for extract- ing noise components from an FM detection signal; noise amplifying means for amplifying a noise compo- nent extracted by the noise extracting means with a gain which is controlled by an automatic gain control signal corresponding to the noise component thus amplified; and control signal generating means for providing an off control signal which is triggered when the output level of the noise amplifying means is higher than prede- termined level, the off control signal is used to interrupt the transmission of the FM detection signal to a follow- ing stage, thereby suppressing pulse noises included in the FM detection signal, wherein the predetermined level at which the control signal generating means is triggered to produce the off control signal is changed according to the automatic gain control signal.

In order to achieve the same object, the present in- vention provides, according to another embodiment thereof, a pulse noise suppressing system for an FM receiver comprising: noise extracting means for extract- ing noise components from an FM detection signal which is detected by an FM detector circuit after being amplified by an intermediate frequency amplifier circuit noise amplifying means for amplifying a noise compo- nent extracted by the noise extracting means with a gain which is controlled by an automatic gain control signal corresponding to the noise component thus amplified, and control signal generating means for providing an off control signal which is triggered when the output level of the noise amplifying means is higher than a predetermined level, the off control signal is used to interrupt the transmission of the FM detection signal to a following stage, thereby suppressing pulse noises in- cluded in the FM detection signal; wherein, the prede- termined level at which the control signal generating means is triggered to produce the off control signal is changed according to a level detection signal corre- sponding to a received signal level which is provided by the intermediate frequency amplifier circuit.

In the pulse noise suppressing system of the invention, a noise component is extracted from an FM detection signal by the noise extracting means and amplified by the noise amplifying means. The gain of the noise amplifying means is controlled by an automatic gain control signal corresponding to the level of the noise component thus amplified. When the output level of the noise amplifying means is higher than the predetermined level, the control signal generating means is triggered to provide the off control signal which is utilized to interrupt the transmission of the FM detection signal to the following stage, thereby suppressing the pulse noise of the FM detection signal. The predetermined value or level at which the control signal generating means is triggered to provide the off signal is changed by the automatic gain control signal reflecting the noise level, or by a signal corresponding to a received signal level which correlates to the noise level.

According to the present invention, the predetermined value or level at which the control signal generating means is triggered is changed by the signal corresponding to the magnitude of the noise component which is included or may be included in the FM detection signal. Therefore, in the case where the noise level is high, it is difficult to generate the off control signal as compared with the case where the noise level is low. Therefore, in the case where the received signal level is low; that is, when the noise level is high, the erroneous operation of the FM receiver can be substantially prevented.

DESCRIPTION OF THE PREFERRED EMBODIMENTS

Preferred embodiments of this invention will now be described with reference to the accompanying drawings.

Figure 1:
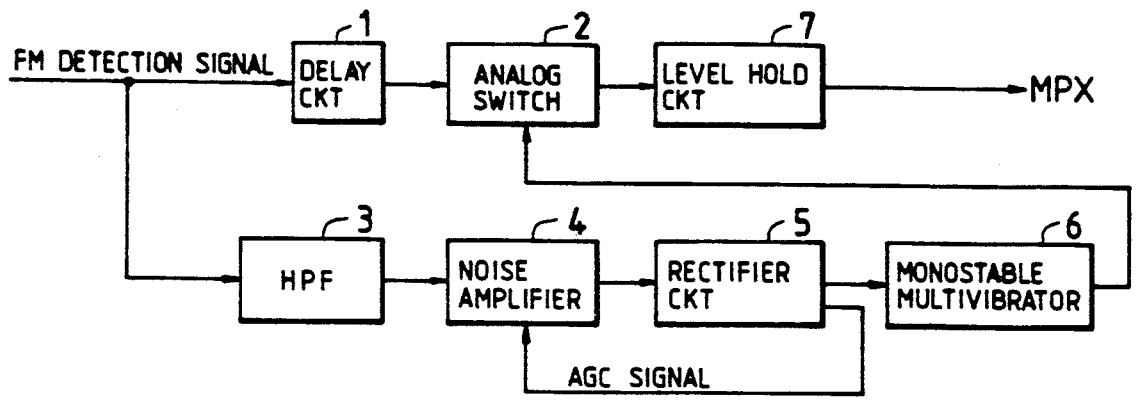
FIG. 1 is a block diagram showing one example of a conventional pulse noise suppressing system for an FM receiver.
Figure 2:
FIG. 2 is an explanatory diagram for describing the operation of the conventional system shown in FIG. 1.
Figure 3:
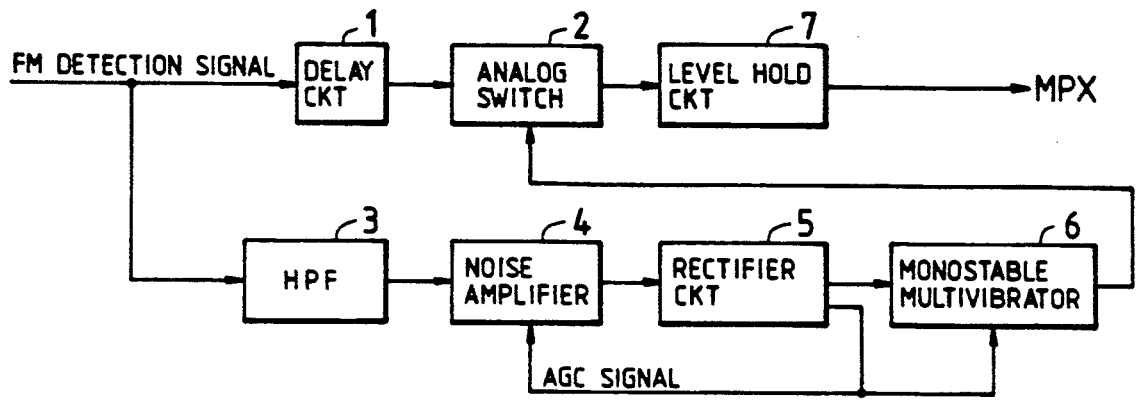
FIG. 3 is a block diagram showing one example of a pulse noise suppressing system for an FM receiver according to the invention.

FIG. 3 shows one example of a pulse noise suppressing system for an FM receiver according to the invention. In FIG. 3, circuit elements functionally corresponding to those which have been described with reference to FIG. 1 are designated by the same reference numerals.

As shown in FIG. 3, the AGC signal provided by the rectifier circuit 5 to control the gain of a noise amplifier 4 is not only applied to a noise amplifier 4, but is also applied to the monostable multivibrator 6. The AGC signal is used to change a predetermined level, namely, a threshold level at which the monostable multivibrator 6 will be triggered to output the off control signal.

Figure 4:
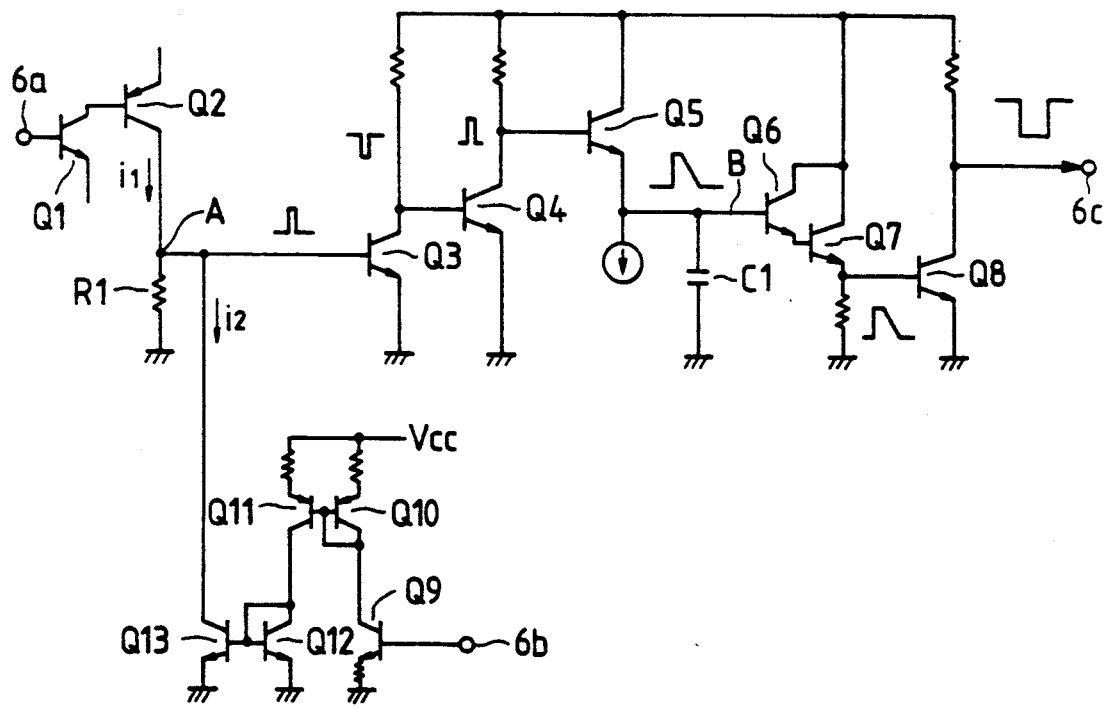
FIG. 4 is a circuit diagram showing a concrete example of a part of the system shown in FIG. 3.

FIG. 4 shows one concrete example of the monostable multivibrator 6 provided with a circuit for changing the trigger threshold level of the monostable multivibrator 6 with the AGC circuit applied thereto. In FIG. 4 reference character 6a designates a first input terminal to which the rectifier circuit 5 applies a level detection signal; and 6b, a second input terminal to which the rectifier circuit 5 applies the AGC signal.

The level detection signal applied to the first input terminal 6a renders a transistor Q1 conductive, so that a current $i_1$ flows in a transistor Q2 whose base is connected to the collector of the transistor Q1. Therefore, a voltage is developed at the connecting point A of the collector of the transistor Q2 and a resistor R1.

When the voltage at the connecting point A is raised to 0.7 V or higher, transistor Q3 is rendered conductive (on), transistor Q4 is rendered non-conductive (off) and transistor Q5 is rendered conductive. When the transistor Q5 is turned on in this manner, capacitor C1 is charged instantaneously so that the voltage at the terminal B of the capacitor C1 is raised approximately to the supply voltage Vcc. As a result, transistors Q6, Q7 and Q8 are rendered conductive, and an "off" control signal which is held at "L" level for a certain period of time is provided at the output terminal 6c.

When the voltage at the connecting point A is decreased to lower than 0.7 V, the transistor Q3 is turned off, the transistor Q4 is turned on, and the transistor Q5 is turned off. As a result, the capacitor C1 is discharged through a constant current source Ic, so that the voltage at the terminal B is decreased. Therefore the transistors Q6, Q7 and Q8 are turned off, and the voltage at the output terminal 6c is restored to the supply voltage Vcc.

When, on the other hand, the AGC signal applied to the second input terminal 6b is raised in level then currents corresponding to the level of the AGC signal flow in transistors Q9 and Q10, transistors Q11 and Q12, and a transistor Q13. The current $i_2$ flowing in the transistor Q13 changes with the level of the AGC signal. Therefore, the current ($i_1-i_2$) flowing in the resistor R1 also changes with the level of the AGC signal, and accordingly the voltage at the connecting point A changes with the level of the AGC signal.

Hence, if, in the case where the level detection signal corresponding to the noise component is increased in level to increase the current $i_1$, the AGC signal is high and accordingly the current $i_2$ is large. As a result, the current ($i_1-i_2$) flowing in the resistor R1 will not increase so as to raise the voltage at the connecting point A to 0.7 V or higher, and therefore the transistor Q3 will not be rendered conductive (on). This will suppress the triggering of the monostable multivibrator 6: i.e., the generation of the "off" control signal for turning off the analog switch, thus preventing the erroneous operation of the FM receiver.

Figure 5:
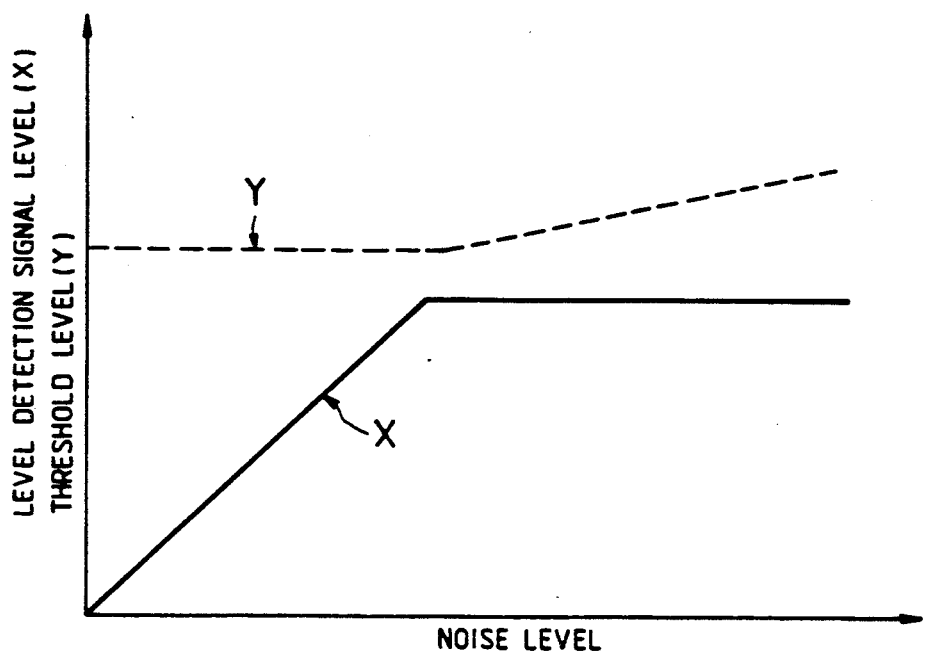
FIG. 5 is a graph showing the relationship between level detection signals and noise levels, and between monostable multivibrator threshold levels and noise level for describing the operation of the circuit shown in FIG. 4, FIGS. 6(a) and 6(b) are explanatory diagrams for describing the effect provided by the system shown in FIGS. 3 and 4.

FIG. 5 is a graphical representation indicating level detection signal levels X with noise levels, and monostable multivibrator threshold levels Y with noise levels in the circuit shown in FIG. 4. As is apparent from FIG. 5, the threshold level is gradually increased after the noise level reaches a certain value.

Figure 6A:
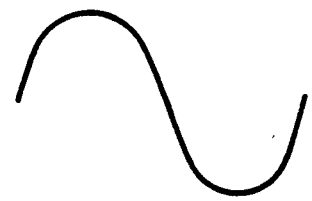
Figure 6B:
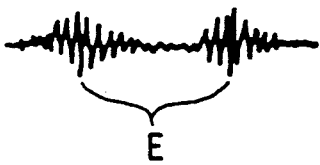

In the above-described embodiment shown in FIG. 3, the threshold level of the monostable multivibrator 6 is changed with the AGC signal, as was described above. This will effectively eliminate the difficultly which occurs when the FM detection signal is large in the degree of modulation, and therefore the distortion component of the modulated wave is increased as shown in FIG. 6(a), and the difficulty which occurs when the distortion component of the output of the HPF 3 includes noise components as shown in FIG. 6(b), and therefore the impulses indicated at E in FIG. 6(b) cause the monostable multivibrator 6 to output the "off" control signal to operate the analog switch 2, whereby distortions or noises are additionally produced or the sensitivity is lowered; that is, the FM receiver will not operate properly.

Thus the noise suppressing system of the invention can prevent the erroneous operation of the FM receiver which is caused by the distortion component of the modulated wave when the degree of modulation is large, or by the noise components whose levels are close to the threshold level of the monostable multivibrator when the input signal level is low.

Figure 7:
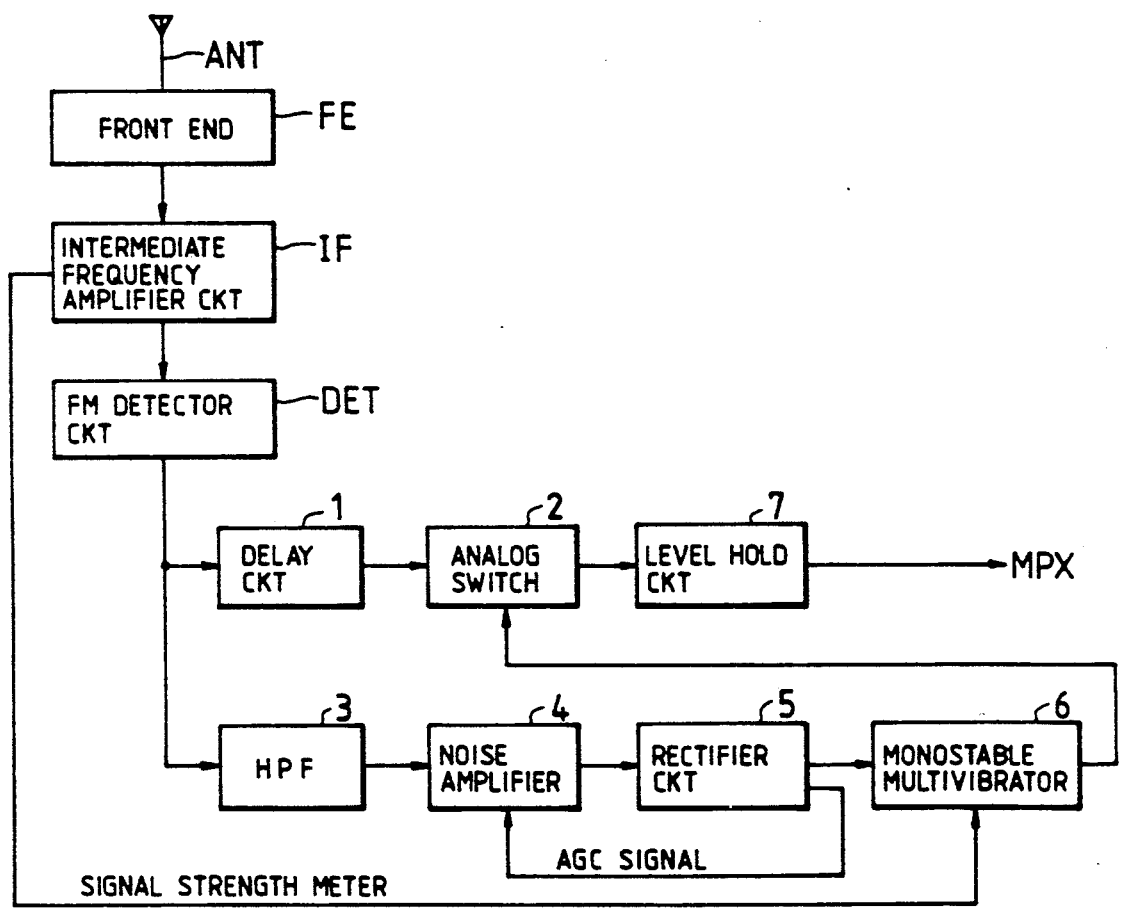
FIG. 7 is a block diagram showing another embodiment of the pulse noise suppressing system according to the invention.

FIG. 7 shows another embodiment of the pulse noise suppressing system according to the invention which is effective in preventing the erroneous operation of the FM receiver when the input signal is low.

Figure 8:
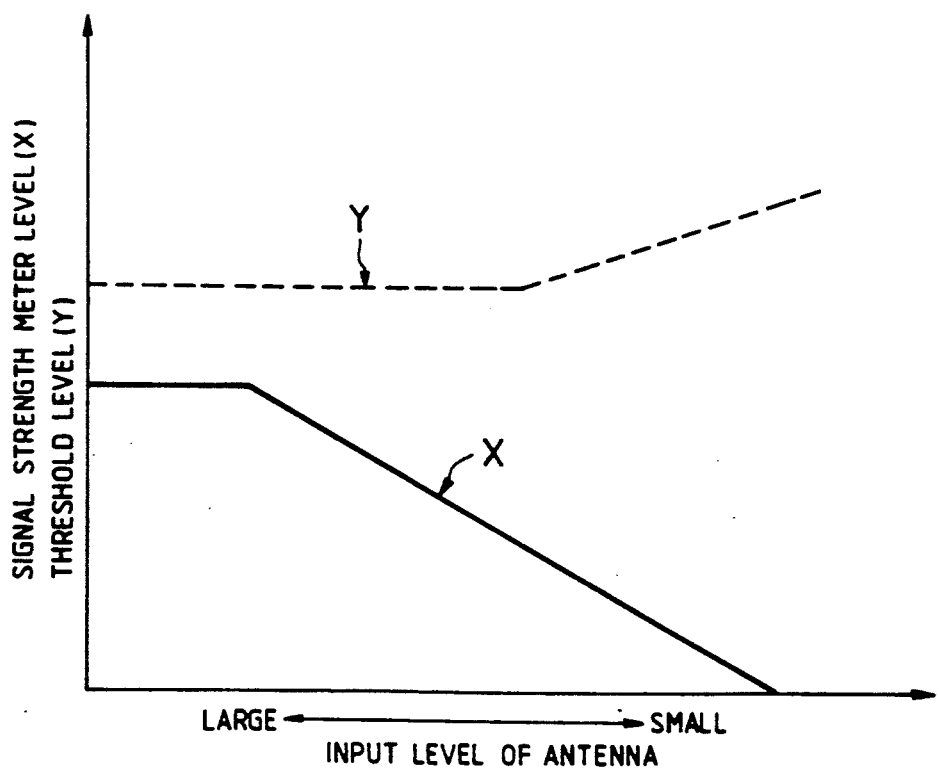
FIG. 8 is a graph showing the relationship between a signal strength meter and a predetermined threshold level according to the embodiment of FIG. 7.

In the system of FIG. 7, an intermediate frequency amplifier circuit IF is connected between a front end FE which converts a high frequency signal received through an antenna ANT into an intermediate frequency signal and an FM detector circuit DET. The intermediate frequency amplifier circuit IF applies a signal strength meter signal corresponding to the level of a received signal, to the monostable multivibrator 6, to drive a signal strength meter, and the threshold level of the monostable multivibrator is changed according to the signal strength meter signal thus applied. When the input signal level is low, the signal strength meter signal is also at a low level. Therefore, in contrast to the system shown in FIG. 3, in the system of FIG. 7 it is necessary to change the threshold level in inverse proportion to the magnitude of the signal strength meter. FIG. 8 shows the relationship between the threshold level and the signal strength meter for the system of FIG. 7.

As the input level of the antenna is small, a noise level becomes larger. Therefore, the threshold level (Y) is changed in accordance with the signal meter level (X) as shown in FIG. 8.

In the above-described embodiments of the invention, the AGC signal and the signal strength meter signal are separately utilized to change the threshold level; however, the systems may be so designed that both the AGC signal and the signal strength meter signal are used in combination, to suppress the noise components, thereby preventing the erroneous operation of the analog switch.

As was described above in the invention, the automatic control signal reflecting the noise level, or the signal corresponding to the received signal level (which correlates to the noise level) is used to change the predetermined level at which the control signal generating means is triggered to produce the off control signal; that is, the predetermined level at which the control signal generating means is triggered is changed by the signal corresponding to the noise which is included or may be included in the FM detection signal. More particularly, according to the present invention, when the noise level is high. it is more difficult to generate the off control signal in comparison with the case where the noise level is low. Thus, in the case where the received signal level is low; that is, the noise level is high, the erroneous operation of the FM receiver can be substantially prevented.

The automatic gain control signal for the noise amplifying means is effective in preventing the erroneous operation of the FM receiver which may be caused not only by noise components which occur when the received signal level is low, but also by the increase in distortion of the modulated wave form when the degree of modulation is large.

What is claimed is:

1. A pulse noise suppressing system for an FM receiver comprising:
   an intermediated frequency amplifier for amplifying an intermediate frequency signal;
   an FM detector circuit, connected to the output of said intermediate frequency amplifier, for outputting an FM detection signal in response to the amplified intermediate frequency signal;
   noise extracting means for extracting a noise component from said FM detection signal;
   noise amplifying means for amplifying the noise component extracted by said noise extracting means with a gain which is controlled by an automatic gain control signal corresponding to the amplified noise component; and
   control signal generating means for providing an off control signal which is triggered when a level of said amplified noise component is higher than a predetermined level, said off control signal being used to interrupt the transmission of said FM detection signal to a following stage, thereby suppressing a pulse noise included in said FM detection signal;
   wherein said predetermined level at which said control signal generating means is triggered to produce said off control signal is changed in accordance with a level detection signal corresponding to a level of the intermediate frequency signal received by said intermediate frequency amplifier circuit 2. The system defined in claim 1, wherein said level detecting signal is a signal strength meter signal which is generated by said intermediate frequency amplifier circuit 3. The system defined in claim 2, wherein the predetermined level of said control signal generating means increases in response to a decrease in said signal strength meter signal.

4. The system defined in claim 1, further comprising an analog switch for preventing the transmission of said FM detection signal in response to said off control signal.

5. The system defined in claim 1, wherein said noise extracting means is a high-pass filter.

6. The system defined in claim 1, wherein said control signal generating means is a monostable multivibrator.

7. The system defined in claim 1, further comprising a rectifier circuit connected to the output of said noise amplifying means, said rectifier circuit outputting a noise detection signal, corresponding to the level of the amplified component, to said control signal generating means, said rectifier circuit also outputting said automatic gain control signal.

8. A method of suppressing a pulse noise for an FM receiver comprising the steps of:

amplifying an intermediate frequency signal;

outputting an FM detection signal in response to the amplified intermediate frequency signal;

extracting a noise component from said FM detection signal;

amplifying the noise component extracted by said noise extracting step with a gain which is controlled by an automatic gain control signal corresponding to the amplified noise component; and providing an off control signal which is triggered when a level of said amplified noise component is higher than a predetermined level, said off control signal being used to interrupt the transmission of said FM detection signal to a following stage, thereby suppressing a pulse noise included in said FM detection signal;

wherein said predetermined level at which said providing step is triggered to produce said off control signal is changed in accordance with a level detection signal corresponding to a level of the intermediate frequency signal.

9. The method defined in claim 8, wherein the level detecting signal is a signal strength meter signal, and the predetermined level of said providing step increases in response to a decrease in said signal strength meter signal.

10. The method defined in claim 8, further comprising the step of preventing the transmission of said FM detection signal in response to said off control signal.

* * * * *